United States Patent
LV et al.

(10) Patent No.: US 10,109,684 B2
(45) Date of Patent: Oct. 23, 2018

(54) PIXEL ELEMENT STRUCTURE, ARRAY STRUCTURE AND DISPLAY DEVICE

(71) Applicants: Shanghai Tianma AM-OLED Co., Ltd., Shanghai (CN); Tianma Micro-Electronics Co., Ltd., Shenzhen (CN)

(72) Inventors: Boyan LV, Shanghai (CN); Liyuan Luo, Shanghai (CN); Dong Qian, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/632,838

(22) Filed: Jun. 26, 2017

(65) Prior Publication Data

US 2017/0294492 A1    Oct. 12, 2017

Related U.S. Application Data

(63) Continuation-in-part of application No. 14/538,759, filed on Nov. 11, 2014, now Pat. No. 9,721,999.

(30) Foreign Application Priority Data

Jul. 28, 2014    (CN) .......................... 2014 1 0363922

(51) Int. Cl.
*H01L 27/32*    (2006.01)
*H01L 51/52*    (2006.01)

(52) U.S. Cl.
CPC ........ *H01L 27/3218* (2013.01); *H01L 27/322* (2013.01); *H01L 27/326* (2013.01);
(Continued)

(58) Field of Classification Search
CPC .................................................... H01L 27/322
See application file for complete search history.

(56) References Cited

U.S. PATENT DOCUMENTS

| 5,467,206 A | 11/1995 | Loiseaux et al. |
| 2005/0225233 A1 | 10/2005 | Boroson et al. |

(Continued)

FOREIGN PATENT DOCUMENTS

| CN | 101262725 A | 9/2008 |
| CN | 103165642 A | 6/2013 |

*Primary Examiner* — Caridad Everhart
*Assistant Examiner* — Ankush Singal
(74) *Attorney, Agent, or Firm* — Anova Law Group, PLLC

(57) ABSTRACT

A display device is disclosed. The display device comprises an array structure comprising a plurality of primary pixel element structures arranged in a matrix. A primary pixel element structure comprises a plurality of pixel element structures arranged in a second direction. A pixel element structure comprises first, second, and third sub-pixel elements, each comprising a light-emitting region and a light-transmitting region disposed at one side of the light-emitting region and adjacent to the light-emitting region in a first direction, and the first direction being perpendicular to the second direction. When the display device is turned off, a scene on an opposite side of the display device is observed by an observer on either side of the display device, and when the display device is turned on, a scene on the opposite side of the display device is observed by the observer on a side where no light is emitted.

16 Claims, 15 Drawing Sheets

(52) U.S. Cl.
CPC ...... *H01L 27/3216* (2013.01); *H01L 27/3244* (2013.01); *H01L 27/3281* (2013.01); *H01L 51/5218* (2013.01); *H01L 51/5234* (2013.01); *H01L 51/5271* (2013.01); H01L 2251/5315 (2013.01)

(56) References Cited

U.S. PATENT DOCUMENTS

| | | | |
|---|---|---|---|
| 2006/0001362 A1 | 1/2006 | Han et al. | |
| 2006/0119556 A1* | 6/2006 | Winters | G09G 3/3225 345/82 |
| 2006/0158467 A1* | 7/2006 | Larson | G02F 1/134309 345/694 |
| 2007/0002084 A1 | 1/2007 | Kimura et al. | |
| 2007/0152578 A1 | 7/2007 | Hung et al. | |
| 2008/0007492 A1* | 1/2008 | Koh | H01L 27/3213 345/76 |
| 2008/0218071 A1 | 9/2008 | Kobayashi | |
| 2009/0135108 A1 | 5/2009 | Lindfors et al. | |
| 2011/0215329 A1 | 9/2011 | Chung | |
| 2011/0272675 A1 | 11/2011 | Chung et al. | |
| 2011/0273409 A1* | 11/2011 | Lee | H01L 27/326 345/204 |
| 2012/0075278 A1 | 3/2012 | Hara et al. | |
| 2012/0153286 A1 | 6/2012 | Yoon et al. | |
| 2012/0268696 A1 | 10/2012 | Yim et al. | |
| 2013/0147851 A1* | 6/2013 | Yim | H01L 27/32 345/690 |
| 2013/0285034 A1 | 10/2013 | Akamatsu et al. | |
| 2013/0328022 A1* | 12/2013 | Choi | H01L 51/5008 257/40 |
| 2014/0014985 A1 | 1/2014 | Sonoda et al. | |
| 2014/0145156 A1 | 5/2014 | Choi et al. | |
| 2014/0284569 A1 | 5/2014 | Kwak et al. | |
| 2014/0183472 A1* | 7/2014 | Kim | H01L 27/3258 257/40 |
| 2014/0183479 A1 | 7/2014 | Park et al. | |
| 2014/0184577 A1* | 7/2014 | Kim, II | G09G 5/10 345/207 |
| 2014/0291669 A1* | 10/2014 | Ji | H01L 29/66969 257/43 |
| 2014/0346469 A1 | 11/2014 | Shin et al. | |
| 2015/0008820 A1* | 1/2015 | Lee | H01L 27/3218 313/504 |
| 2015/0029235 A1 | 1/2015 | Sato | |
| 2015/0090985 A1 | 4/2015 | Park et al. | |
| 2015/0102306 A1* | 4/2015 | Shi | H01L 27/3248 257/40 |
| 2015/0124199 A1 | 5/2015 | Su et al. | |
| 2015/0162387 A1 | 6/2015 | Gu et al. | |

* cited by examiner

US 10,109,684 B2

PIXEL ELEMENT STRUCTURE, ARRAY STRUCTURE AND DISPLAY DEVICE

CROSS-REFERENCES TO RELATED APPLICATIONS

This application is a continuation-in-part (CIP) application of U.S. patent application Ser. No. 14/538,759, filed on Nov. 11, 2014, which claims priority to Chinese patent application No. 201410363922.9, entitled "PIXEL ELEMENT STRUCTURE, ARRAY STRUCTURE AND DISPLAY DEVICE", filed with the State Intellectual Property Office of People's Republic of China on Jul. 28, 2014, the entire contents of which are incorporated herein by reference.

BACKGROUND

Compared with liquid crystal display devices and plasma display devices widely applied at present, Organic Light-Emitting Diode (OLED) display devices have earned increasing attention due to their self-illuminating, diversity of colors, high response speed, wide angle of view, light weight, low thickness, low power consumption, flexible display capability and other advantages.

Typically an OLED display device is consisted of a glass substrate, an Indium Tin Oxide (ITO) anode, an organic layer (including an organic light-emitting material layer), a semitransparent cathode and other components, wherein when voltage is applied to the anode, holes of the anode and electrons of the cathode are combined at the organic light-emitting material layer to excite the organic material in the organic light-emitting material layer to emit light. The OLED display device can generally fall into the two categories of a Below-Emitting OLED (BEOLED) display device and a Top-Emitting OLED (TEOLED) display device.

SUMMARY

One aspect of the present disclosure provides a display device. The display device comprises an array structure comprising a plurality of primary pixel element structures arranged in a matrix. A primary pixel element structure comprises a plurality of pixel element structures arranged in a second direction. A pixel element structure comprises first, second, and third sub-pixel elements, each comprising a light-emitting region and a light-transmitting region disposed at one side of the light-emitting region and adjacent to the light-emitting region in a first direction, and the first direction being perpendicular to the second direction. When the display device is turned off, a scene on an opposite side of the display device is observed by an observer on either side of the display device, and when the display device is turned on, a scene on the opposite side of the display device is observed by the observer on a side where no light is emitted.

DETAILED DESCRIPTION OF THE EMBODIMENTS

Figure 1:
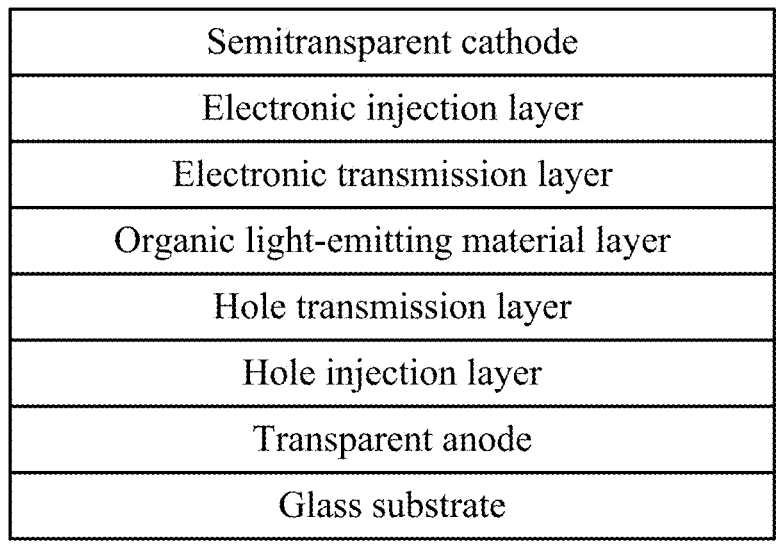
FIG. 1 is a schematic structural diagram of an OLED display device.
Figure 2A:
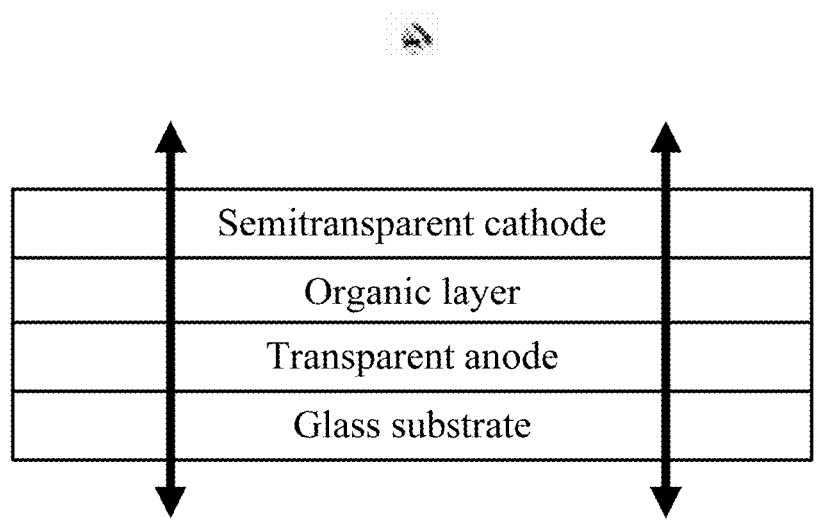
FIG. 2*a* and FIG. 2*b* are schematic structural diagrams of an OLED display device emitting light on both sides.
Figure 2B:
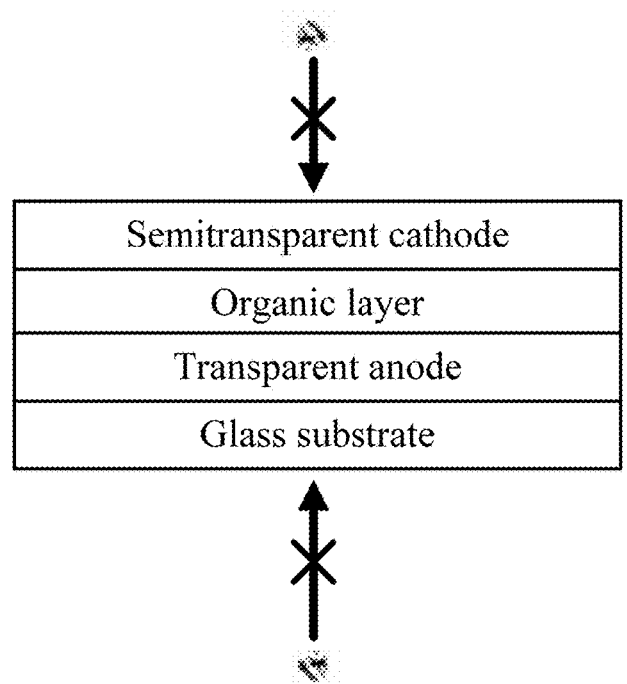

FIG. 1 illustrates a schematic structural diagram of a transparent OLED display device. A transparent OLED includes a transparent glass substrate, and a transparent anode arranged on the transparent glass substrate, a hole injection layer, a hole transmission layer, a light-emitting layer, an electronic transmission layer, an electronic injection layer and a semitransparent cathode, in that order. Referring to FIG. 2*a*, when the OLED is turned off, a scene on an opposite side of the OLED can be observed by an observer on either side of the OLED; and referring to FIG. 2b, when the OLED is turned on, no scene on the opposite of the OLED can be observed by the observer on either side of the OLED, and a display picture of the OLED observed by the observer on the back side of the OLED is opposite to a display picture of the OLED observed by the observer on the front side of the OLED.

In order to address the problems of high power consumption of an OLED display device emitting light on both sides and low light-emitting efficiency of the OLED display device emitting light on a single side in the prior art, an embodiment of the present disclosure provides a pixel element structure including a set of sub-pixel elements and a first sub-pixel element in another set of sub-pixel elements adjacent to the set of sub-pixel elements, wherein the set of sub-pixel elements includes a second sub-pixel element and a third sub-pixel element, each of the first sub-pixel element, the second sub-pixel element and the third sub-pixel element includes a light-emitting region, and any one of the first sub-pixel element, the second sub-pixel element and the third sub-pixel element includes a light-transmitting region; and the light-emitting region in each of the first sub-pixel element, the second sub-pixel element and the third sub-pixel element includes a first substrate, and a nontransparent anode, a pixel defining layer, an organic layer and a cathode, arranged above the first substrate, in that order. With the technical solution of the present disclosure, the nontransparent anode is used in the organic light-emitting diode light-emitting structure to thereby emit light on a single side so as to lower power consumption of an OLED display device; and the set of sub-pixel elements and the first sub-pixel element adjacent to the set of sub-pixel elements constitute a color pixel element structure, and the light-transmitting region is added to any one of the sub-pixel elements above to thereby improve effectively the transmissivity of light rays of a display panel by means of the light-transmitting region so as to achieve transparent display of the OLED display device.

Preferred embodiments of the present disclosure will be described below in details with reference to the drawings.

Figure 3:
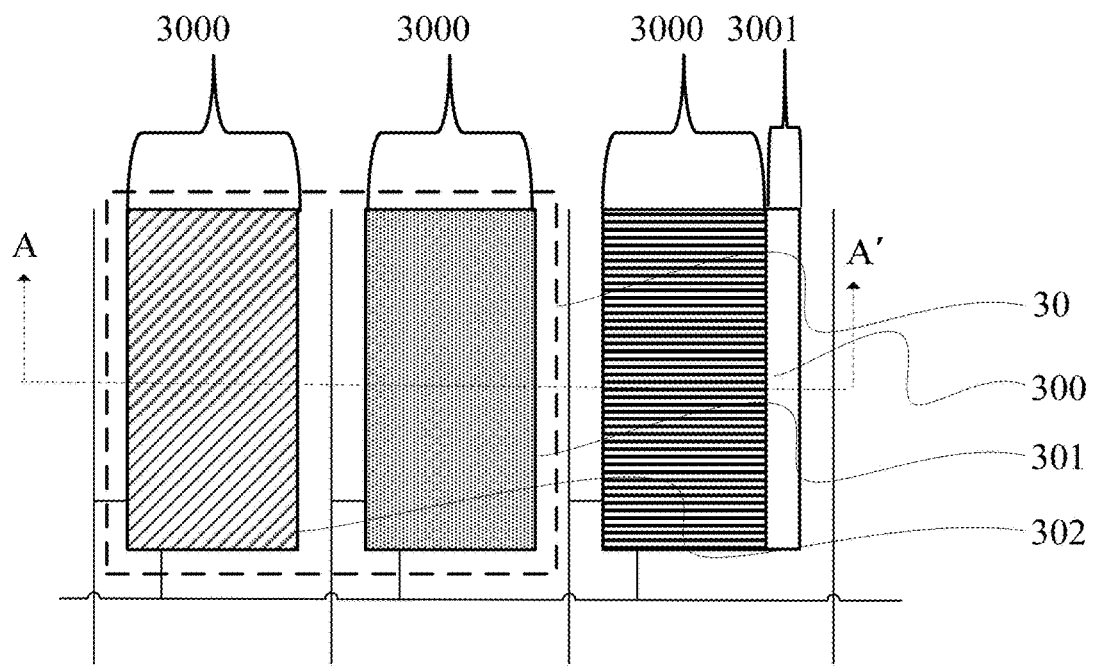
FIG. 3 is a schematic structural diagram in a top view of a pixel element structure according to an embodiment of the present disclosure.

FIG. 3 illustrates a schematic diagram of a pixel element structure in a top view provided by an embodiment of the present disclosure, as illustrated in the figure, the pixel element structure includes a set of sub-pixel elements 30 and a first sub-pixel element 300 in another set of sub-pixel elements adjacent to the set of sub-pixel elements 30, wherein the set of sub-pixel elements 30 includes a second sub-pixel element 301 and a third sub-pixel element 302, and each of the first sub-pixel element 300, the second sub-pixel element 301 and the third sub-pixel element 302 includes a light-emitting region 3000.

Figure 4:
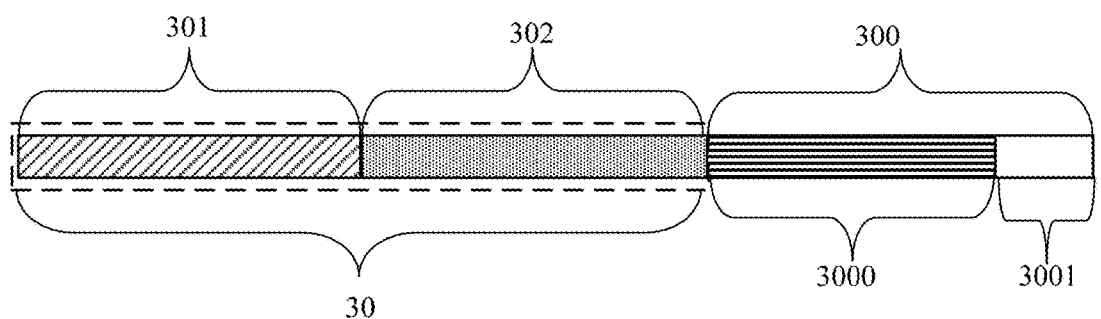
FIG. 4 is a schematic structural diagram in a sectional view of the pixel element structure illustrated in FIG. 3 according to the embodiment of the present disclosure.

Particularly, FIG. 4 illustrates a schematic structural diagram of the pixel element structure in a sectional view provided by the embodiment of the invention. The schematic structural sectional view of the pixel element structure in FIG. 4 is a schematic structural sectional view in the A-A' direction of the schematic structural top view of the pixel element structure illustrated in FIG. 3. As illustrated in the figure, any one of the first sub-pixel element 300, the second sub-pixel element 301 and the third sub-pixel element 302 includes a light-transmitting region 3001, wherein the light-emitting region in each of the sub-pixel elements above includes an organic light-emitting diode light-emitting structure 3000', and the area of the light-emitting region 3000 is equal to the area of the organic light-emitting diode light-emitting structure 3000' in a top view.

Figure 5:
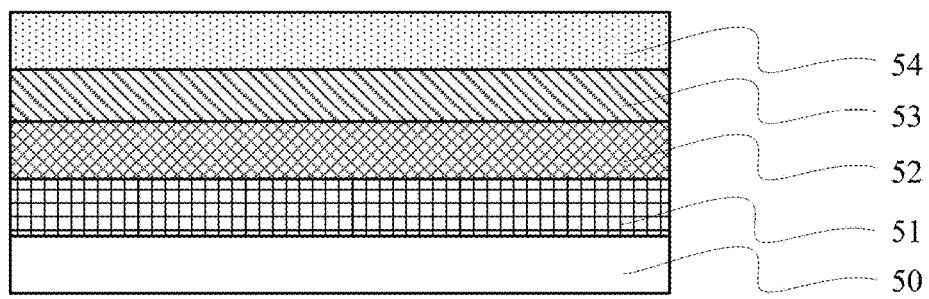
FIG. 5 is a schematic structural diagram of an organic light-emitting diode light-emitting structure according to an embodiment of the present disclosure.

Optionally, FIG. 5 illustrates a schematic structural diagram of the organic light-emitting diode light-emitting structure 3000' provided by an embodiment of the present disclosure. As illustrated in FIG. 5, the organic light-emitting diode light-emitting structure 3000' includes a first substrate 50, and a nontransparent anode 51, a pixel defining layer 52, an organic layer 53 and a cathode 54, arranged above the first substrate 50, in that order; and the light-transmitting region in each of the sub-pixel elements above is arranged as a transparent film layer structure including an insulation layer, an organic film layer, etc., to thereby improve the transmissivity of each sub-pixel element, wherein the cathode 54 above is a semitransparent cathode made of a semitransparent metal material, and the nontransparent anode above is made of ITO or ITO Ag ITO.

With the technical solution above, light can be emitted on a single side of a display device due to the nontransparent anode 51 and the top-emitting structure to thereby avoid the problems of an energy waste due to light emission on both sides and inefficient light emission; and an aperture ratio of the display device can be improved effectively by using the top-emitting structure. Moreover, when the display device is turned off, a scene on an opposite side of the display device can be observed by an observer on either side of the display device; and when the display device is turned on, a scene on the opposite side of the display device can be observed by the observer on the side where no light is emitted (on the back side), so that there will be a transparent effect regardless of whether the display device is turned on or turned off.

Optionally, the first sub-pixel element 300, the second sub-pixel element 301 and the third sub-pixel element 302 above are sub-pixel element in three different colors, and the three different colors are red, blue and green respectively, that is, the first sub-pixel element 300 above is a sub-pixel element in any one color of red, blue and green, and the second sub-pixel element 301 and the third sub-pixel element 302 above are sub-pixel elements in the other two colors than the color of first sub-pixel element 300 among the red sub-pixel element, the blue sub-pixel element and the green sub-pixel element. For example, when the first sub-pixel element 300 is a red sub-pixel element, the second sub-pixel element 301 is a blue sub-pixel element and the third sub-pixel element 302 is a green sub-pixel element, or the second sub-pixel element 301 is a green sub-pixel element and the third sub-pixel element 302 is a blue sub-pixel element; when the first sub-pixel element 300 is a blue sub-pixel element, the second sub-pixel element 301 is a red sub-pixel element and the third sub-pixel element 302 is a green sub-pixel element, or the second sub-pixel element 301 is a green sub-pixel element and the third sub-pixel element 302 is a red sub-pixel element; and when the first sub-pixel element 300 is a green sub-pixel element, the second sub-pixel element 301 is a red sub-pixel element and the third sub-pixel element 302 is a blue sub-pixel element, or the second sub-pixel element 301 is a blue sub-pixel element and the third sub-pixel element 302 is a red sub-pixel element.

Figure 6A:
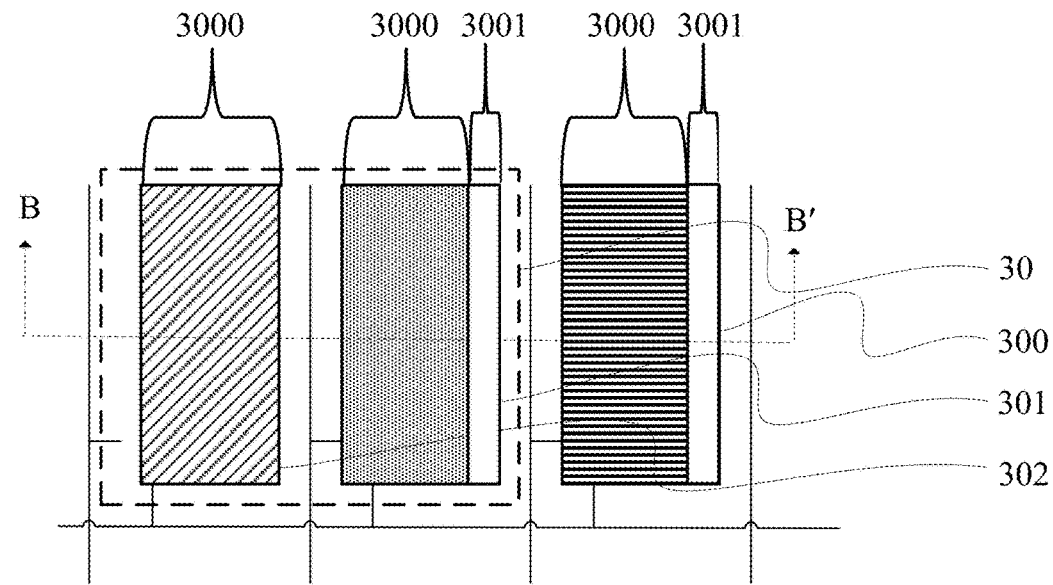
FIG. 6*a* is another schematic structural diagram in a top view of the pixel element structure according to the embodiment of the present disclosure.
Figure 6B:
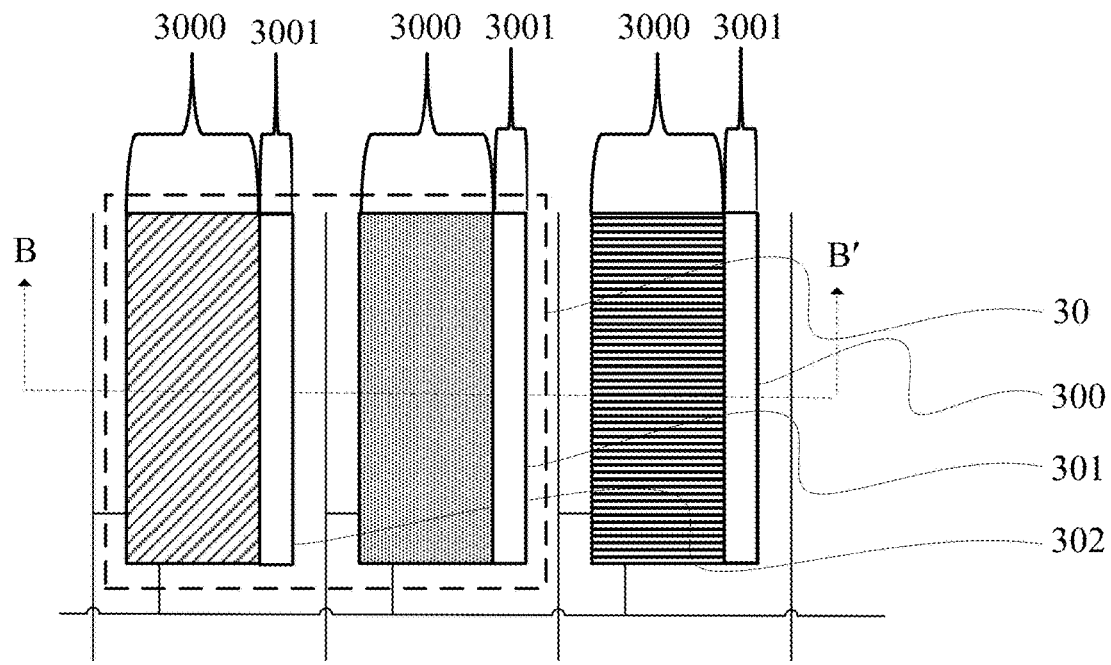
FIG. 6*b* is another schematic structural diagram in a top view of the pixel element structure according to the embodiment of the present disclosure.

In the pixel element structure illustrated in FIG. 4, only one of the three sub-pixel elements includes a light-transmitting region 3001. Optionally, in other embodiments of the present disclosure, any two of the three sub-pixel elements include light-transmitting regions 3001; or each of the three sub-pixel elements includes a light-transmitting region 3001. FIG. 6a and FIG. 6b illustrate schematic structural diagrams of another pixel element structure in top views provided by an embodiment of the present disclosure. As illustrated in FIG. 6a, the pixel element structure includes the set of sub-pixel elements 30 and the first sub-pixel element 300 adjacent to the set of sub-pixel elements 30, and the set of sub-pixel elements 30 include the second sub-pixel element 301 and the third sub-pixel element 302, wherein any two of the first sub-pixel element 300, the second sub-pixel element 301 and the third sub-pixel element 302 include a light-transmitting region 3001 each, for example, each of the first sub-pixel element and the second sub-pixel element includes a light-transmitting region 3001. As illustrated in FIG. 6b, each of the first sub-pixel element 300, the second sub-pixel element 301 and the third sub-pixel element 302 includes a light-transmitting region 3001, that is, all of the first sub-pixel element 300, the second sub-pixel element 301 and the third sub-pixel element 302 include light-transmitting regions 3001.

Figure 7A:
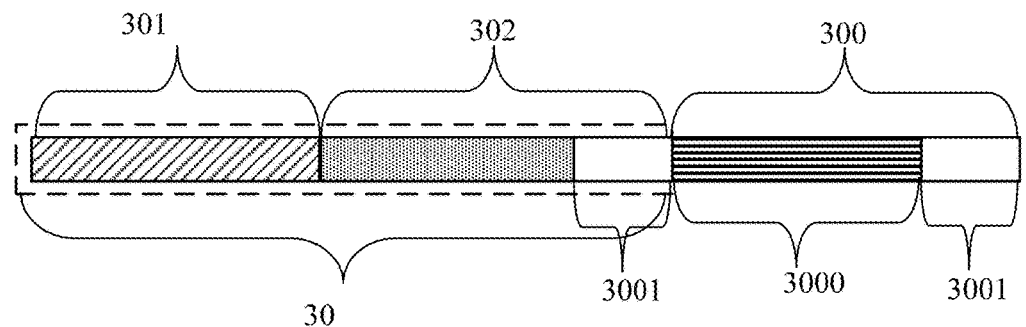
FIG. 7*a* is a schematic structural diagram in a sectional view of the pixel element structure illustrated in FIG. 6*b* according to the embodiment of the present disclosure.
Figure 7B:
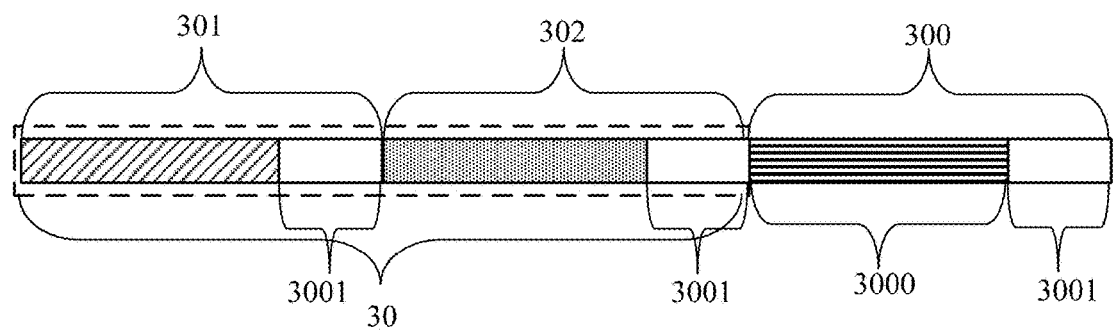
FIG. 7*b* is another schematic structural diagram in a sectional view of the pixel element structure according to the embodiment of the present disclosure.

FIG. 7a illustrates a schematic structural sectional view in the B-B' direction of the schematic structural top view of the pixel element structure illustrated in FIG. 6a according to the embodiment of the present disclosure; and FIG. 7b illustrates a schematic structural sectional view in the B-B' direction of the schematic structural top view of the pixel element structure illustrated in FIG. 6b according to the embodiment of the present disclosure.

Figure 8A:
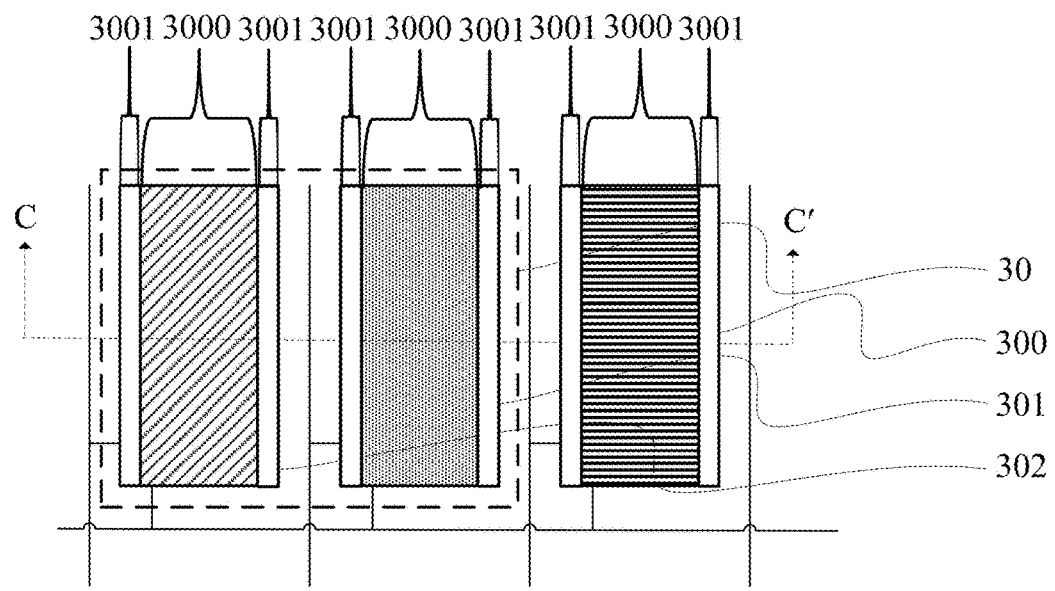
FIG. 8*a* is another schematic structural diagram in a top view of the pixel element structure according to the embodiment of the present disclosure.
Figure 8B:
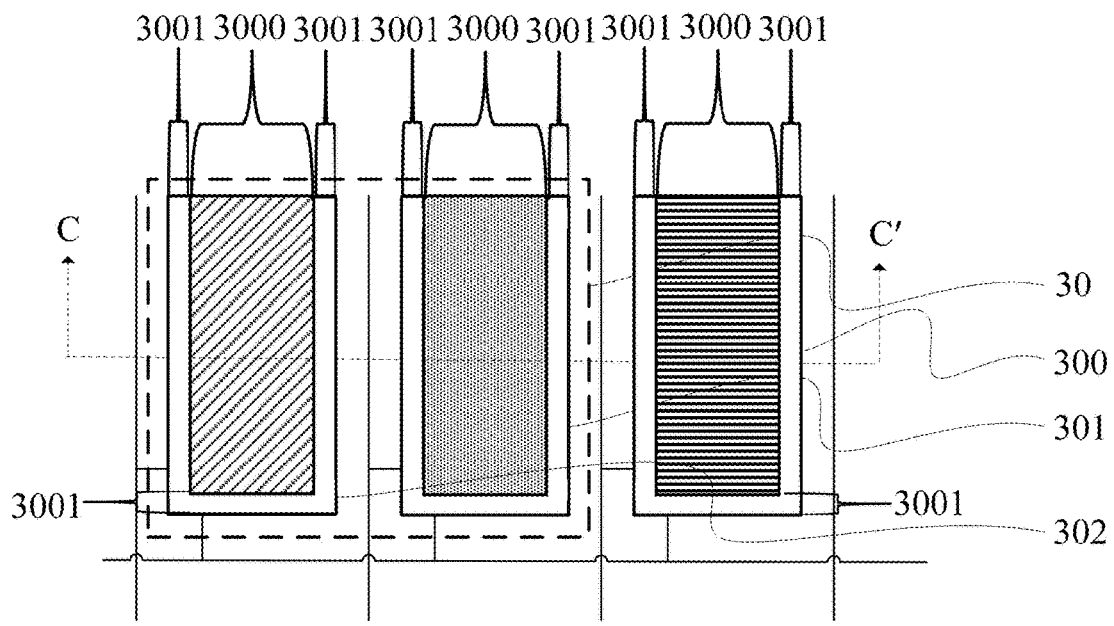
FIG. 8*b* is another schematic structural diagram in a top view of the pixel element structure according to the embodiment of the present disclosure.

Optionally, the light-transmitting regions 3001 in the sub-pixel elements above are located on at least one side of the organic light-emitting diode light-emitting structures 3000'. For example, FIG. 8a illustrates a schematic structural diagram of the pixel element structure in a top view with the light-transmitting regions 3001 located on two sides of the organic light-emitting diode light-emitting structures 3000' according to the embodiment of the present disclosure, wherein the light-transmitting regions 3001 are located on any two sides of the organic light-emitting diode light-emitting structures 3000'; FIG. 8b illustrates a schematic structural diagram of the pixel element structure in a top view with the light-transmitting regions 3001 located on three sides of the organic light-emitting diode light-emitting structures 3000' according to the embodiment of the present disclosure; and FIG. 8c illustrates a schematic structural diagram of the pixel element structure in a top view with the light-transmitting regions 3001 totally encircling the organic light-emitting diode light-emitting structures 3000' according to the embodiment of the present disclosure.

Figure 8C:
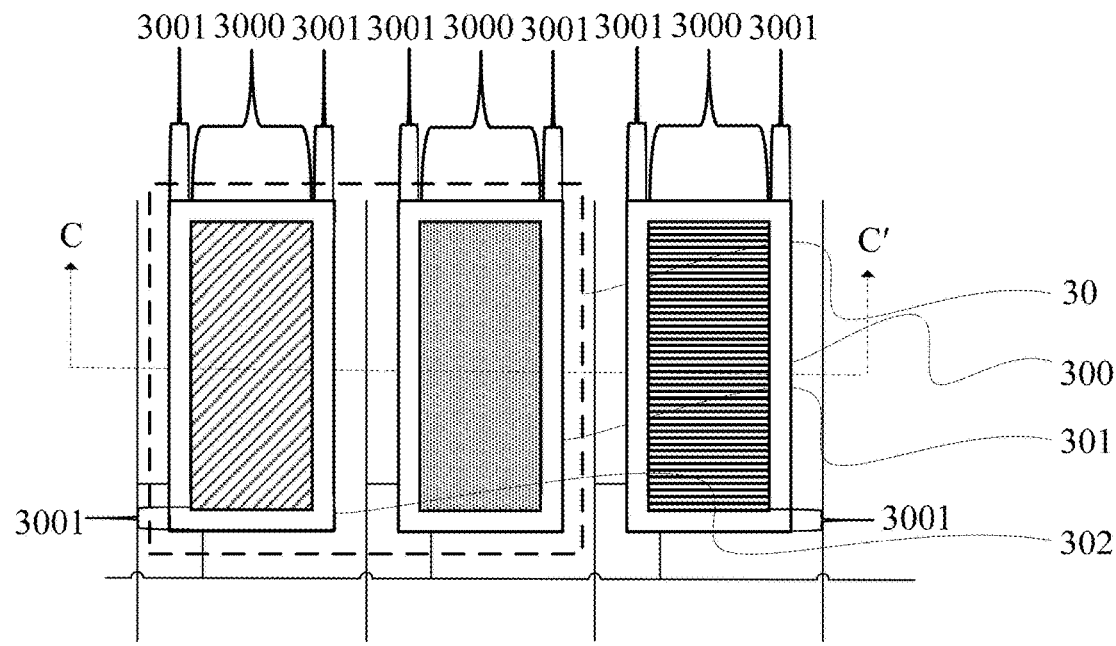
FIG. 8*c* is another schematic structural diagram in a top view of the pixel element structure according to the embodiment of the present disclosure.
Figure 9:
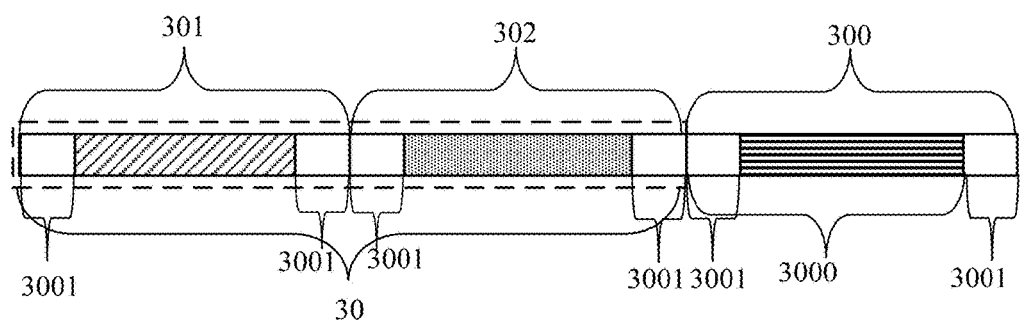
FIG. 9 is a schematic structural diagram in a sectional view of the pixel element structure illustrated in FIG. 8*a* according to the embodiment of the present disclosure.

FIG. 9 illustrates a schematic structural sectional view in the C-C' direction of the schematic structural top view of the pixel element structure illustrated in FIG. 8a, FIG. 8b and FIG. 8c according to the embodiment of the present disclosure. Referring to FIG. 9, all the areas of the light-transmitting regions 3001 in the first sub-pixel element 300, the second sub-pixel element 301 and the third sub-pixel element 302 above are the same, or none of the areas of the light-transmitting regions 3001 in the first sub-pixel element 300, the second sub-pixel element 301 and the third sub-pixel element 302 above is the same as any other of the areas, or the areas of the light-transmitting regions 3001 in any two of the first sub-pixel element 300, the second sub-pixel element 301 and the third sub-pixel element 302 above are the same, and the area of the light-transmitting region 3001 in the remaining sub-pixel element other than the two sub-pixel elements is different from the areas of the light-transmitting regions 3001 in the two sub-pixel elements above. With this technical solution, the arrangement of the same areas of the light-transmitting regions 3001 in the respective sub-pixel elements in the pixel element structure above can facilitate manufacturing the OLED display device including the pixel element structure as well as guaranteeing a display effect of the OLED display device and preventing linear Mura, edge Mura, etc.

Optionally all the locations of the light-transmitting regions 3001 in the first sub-pixel element 300, the second sub-pixel element 301 and the third sub-pixel element 302 above are the same, or none of the locations of the light-transmitting regions 3001 in the first sub-pixel element 300, the second sub-pixel element 301 and the third sub-pixel element 302 above is the same as any other of the locations, or the locations of the light-transmitting regions 3001 in any two of the first sub-pixel element 300, the second sub-pixel element 301 and the third sub-pixel element 302 above are the same, and the location of the light-transmitting region 3001 in the remaining sub-pixel element other than the two sub-pixel elements is different from the locations of the light-transmitting regions 3001 in the two sub-pixel elements above. Preferably all the locations of the light-transmitting regions 3001 in the respective sub-pixel elements in the pixel element structure above are the same, and with this technical solution, the arrangement of the same location of the light-transmitting regions 3001 in the respective sub-pixel elements can facilitate manufacturing the OLED display device including the pixel element structure to thereby guarantee a display effect of the OLED display device and prevent linear Mura, edge Mura, etc.

Furthermore, as illustrated in FIG. 9, in order to avoid a loss of the aperture ratio for light emission, the area of a light-emitting region in each sub-pixel element in the set of sub-pixel elements including two sub-pixel elements is the same as a total light-emitting area in a pixel element including three sub-pixel elements in an existing non-transparent display device, that is, equivalently the area or less of one sub-pixel element in the pixel element including three sub-pixel elements in the existing non-transparent display device is defined as the light-transmitting region 3001, so the area of the light-transmitting region 3001 in each sub-pixel element including the light-transmitting region 3001 is smaller than or equal to one third of the area of the sub-pixel element.

Optionally in the embodiment of the present disclosure, the set of sub-pixel elements can constitute an elementary color pixel element structure for full-color display together with the first sub-pixel element in the other adjacent set of sub-pixel elements, that is, with the technology of pixel rendering, any one set of sub-pixel elements 30 can display any one color together with the first sub-pixel element 300 adjacent thereto as a result of cooperation between sets of sub-pixel elements. With the technology of pixel rendering above, a display effect achieved by three sub-pixel elements can be achievable by two sub-pixel elements to thereby solve the problem of degraded pixels due to the addition of the transparent regions to a sub-pixel elements so as to ensure a display effect of the display device including the pixel element structure and facilitate an improvement in resolution of the display device.

Optionally the organic light-emitting diode light-emitting structure 3000' in each sub-pixel element of the pixel element structure above is a passive matrix top-emitting organic light-emitting diode structure; or the organic light-emitting diode light-emitting structure 3000' in each sub-pixel element of the pixel element structure above is an active matrix top-emitting organic light-emitting diode structure.

Figure 10:
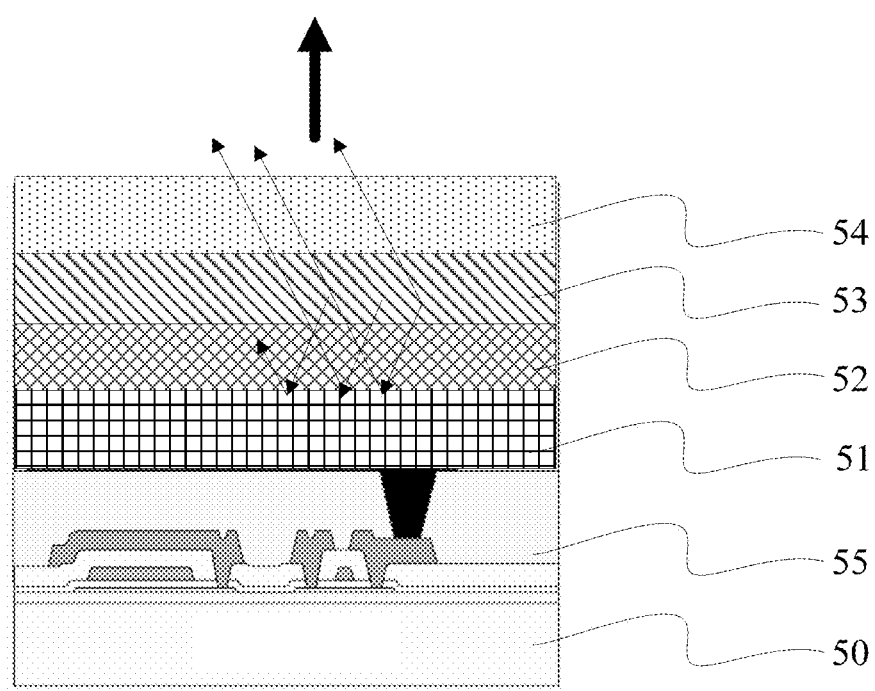
FIG. 10 is a schematic structural diagram in a sectional view of the pixel element structure illustrated in FIG. 8*b* according to the embodiment of the present disclosure.

FIG. 10 illustrates a schematic structural diagram of an active matrix top-emitting organic light-emitting diode structure, wherein the organic light-emitting diode light-emitting structure 3000' in each sub-pixel element is an active matrix top-emitting organic light-emitting diode structure according to the embodiment of the present disclosure. As illustrated in FIG. 10, the pixel element structure includes the organic light-emitting diode light-emitting structure 3000' and also a set of thin film transistors with or without pixel circuit compensation function, and only a drive thin film transistor 55 connected directly with the organic light-emitting diode light-emitting structure 3000' is illustrated in FIG. 10.

Figure 11:
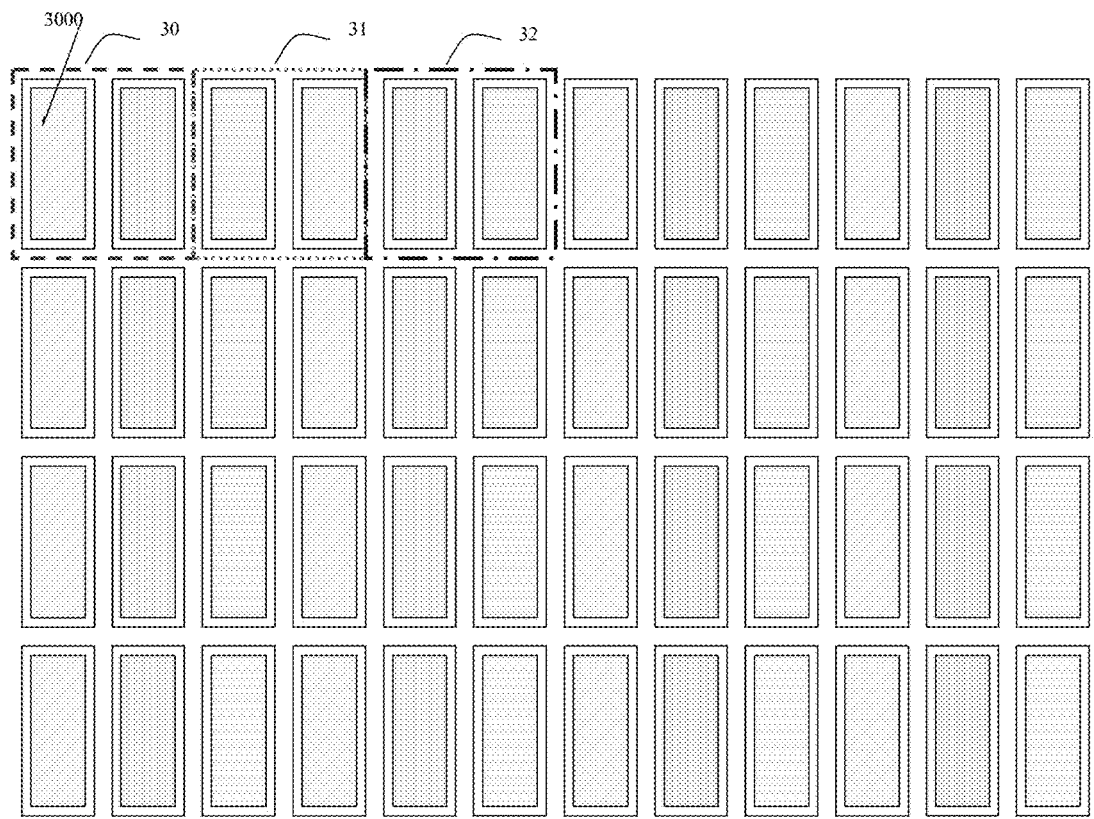
FIG. 11 is a schematic structural diagram of an array structure in a top view according to an embodiment of the present disclosure.

An embodiment of the present disclosure, referring to FIG. 11, further provides an array substructure including the pixel element structure above.

Figure 12A:
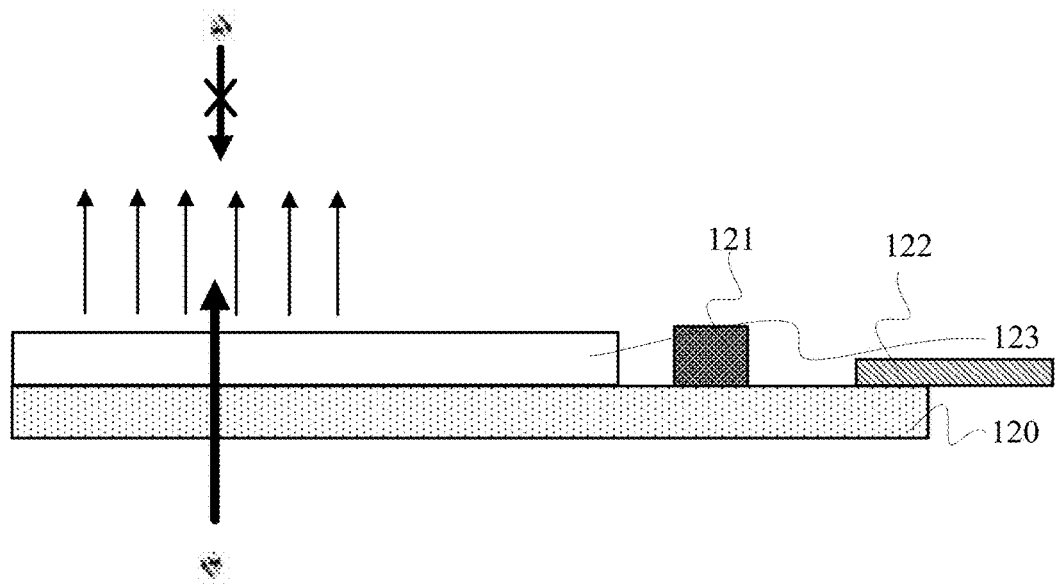
FIG. 12*a* and FIG. 12*b* are schematic structural diagrams of a display device in section views according to an embodiment of the present disclosure.
Figure 12B:
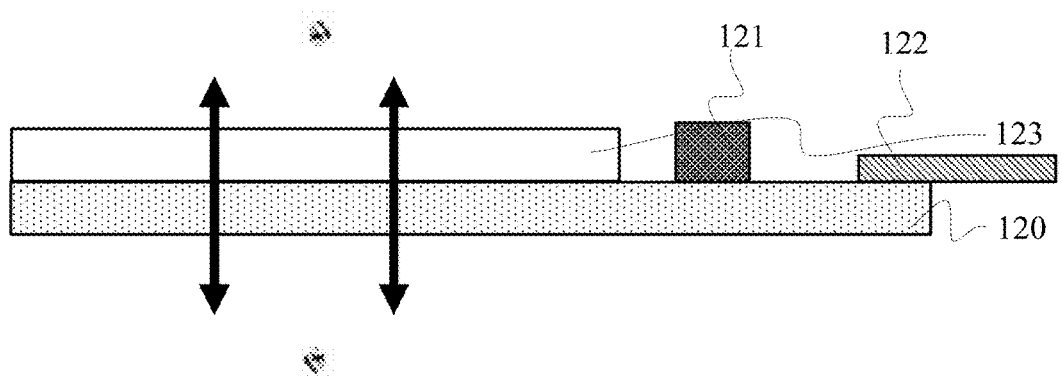

An embodiment of the present disclosure, referring to FIG. 12a and FIG. 12b, further provides a display device including the array structure 120 above and also an IC drive circuit 121, a flexible circuit board 122 and a second substrate 12, above the array structure. As illustrated in FIG. 12b, when the display device is turned off, a scene on an opposite side of the display device can be observed by an observer on either side of the display device, and as illustrated in FIG. 12a, when the display device is turned on, a scene on the opposite side of the display device can be observed by the observer on the side where no light is emitted (on the back side), so that there will be a transparent effect regardless of whether the display device is either turned on or turned off.

In summary, an embodiment of the present disclosure provides a pixel element structure including a set of sub-pixel elements and a first sub-pixel element in another set of sub-pixel elements adjacent to the set of sub-pixel elements, wherein the set of sub-pixel elements includes a second sub-pixel element and a third sub-pixel element; each of the first sub-pixel element, the second sub-pixel element and the third sub-pixel element includes a light-emitting region; the second sub-pixel element or the third sub-pixel element in each set of sub-pixel elements includes a light-transmitting region; the light-emitting region includes an organic light-emitting diode light-transmitting structure; and the organic light-emitting diode light-transmitting structure includes a first substrate, and a nontransparent anode, a pixel defining layer, an organic layer and a cathode, arranged above the first substrate, in that order.

With the technical solution of the present disclosure, the nontransparent anode is used in the organic light-emitting diode light-emitting structure to thereby emit light on a single side so as to lower power consumption of an OLED display device; and the set of sub-pixel elements and the first sub-pixel element adjacent to the set of sub-pixel elements constitute a color pixel element structure, and the light-transmitting region is added to any one of the sub-pixel elements above to thereby improve effectively the transmissivity of light rays of a display panel by means of the light-transmitting region so as to achieve transparent display of the OLED display device.

In certain embodiments, in one pixel element structure, each sub-pixel element may include a light-transmitting region, and the light-transmitting regions of all the sub-pixel elements may be combined together to form a pixel light-transmitting region. Further, the pixel light-transmitting regions of a plurality of adjacent pixel element structures may also be combined together to form a primary pixel light-transmitting region. The pixel light-transmitting region and the primary pixel light-transmitting region may be continuous light-transmitting regions without any light-emitting regions and light-shielding regions. Exemplary structures are shown in FIGS. 13-14.

Figure 13:
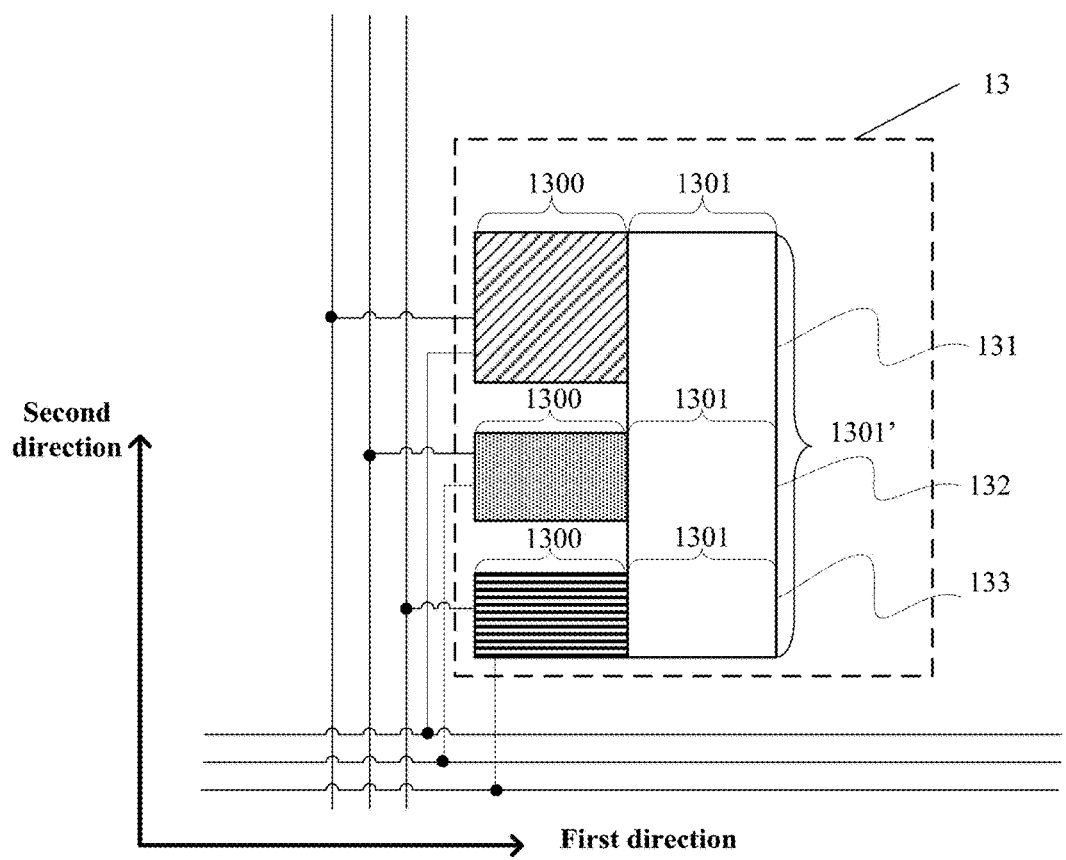
FIG. 13 is another schematic structural diagram in a top view of the pixel element structure according to an embodiment of the present disclosure.
Figure 14:
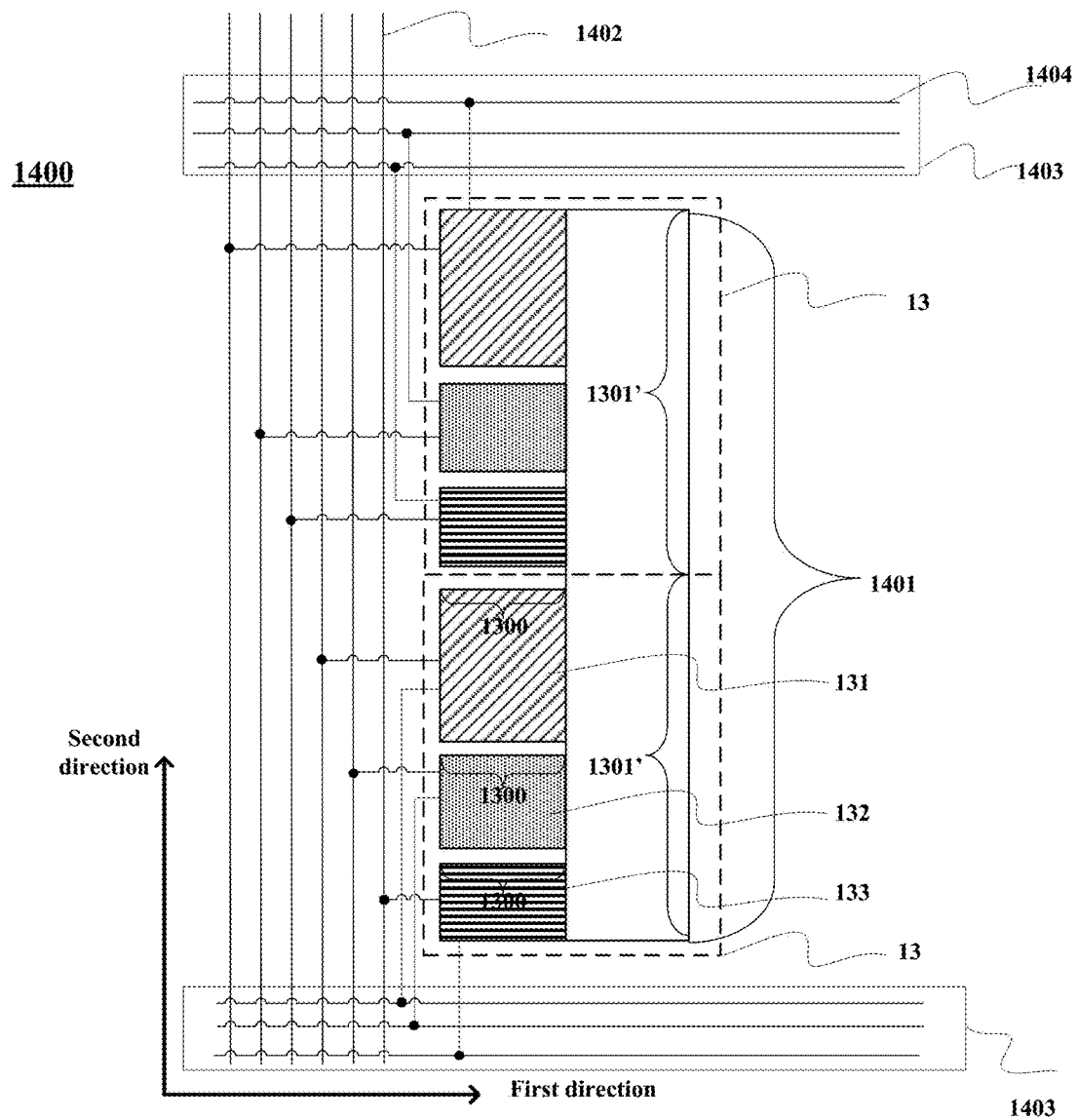
FIG. 14 is a schematic structural diagram in a top view of a primary pixel element structure according to an embodiment of the present disclosure.

FIG. 13 is another schematic structural diagram in a top view of the pixel element structure according to an embodiment of the present disclosure. As shown in FIG. 13, the pixel element structure 13 may include a first sub-pixel element 131, a second sub-pixel element 132, and a third sub-pixel element 133 arranged in a second direction. Each of the first sub-pixel element 131, the second sub-pixel element 132 and the third sub-pixel element 133 may include a light-emitting region 1300 and a light-transmitting region 1301. In each sub-pixel element, the light-transmitting region 1301 may be located on one side of the light-emitting region 1300 and, meanwhile, adjacent to the light-emitting region 1300 in a first direction. The second direction may intersect the first direction In particular, the light-transmitting regions 1301 in the first sub-pixel element 131, the second sub-pixel element 132 and the third sub-pixel element 133 may be combined together to form a pixel light-transmitting region 1301'. The pixel light-transmitting region may be a continuous light-transmitting region without any light-emitting regions and light-shielding regions.

The light-emitting region in each of the sub-pixel elements may include an organic light-emitting structure 1300, such as an organic light-emitting diode light-emitting structure, and the area of the light-emitting region 1300 may be equal to the area of the organic light-emitting diode light-emitting structure in the top view. The organic light-emitting structure 1300 may have a similar structure as shown in FIG. 5, which is not repeated here.

The light-transmitting region 1301 in each of the sub-pixel elements may be arranged as a transparent film layer structure including an insulation layer, an organic film layer, etc., to thereby improve the transmissivity of each sub-pixel element. Accordingly, the formed pixel light-transmitting region 1301' may also be arranged as a transparent film layer structure including an insulation layer, an organic film layer, etc. Because the pixel light-transmitting region, which is formed by combining the light-transmitting region 1301 in each of the sub-pixel elements, is a continuous light-transmitting region without any light-emitting regions and light-shielding regions, the transmissivity of the pixel element structure 13 may be further improved.

When the pixel element structure 13 is turned off, a scene on an opposite side of the pixel element structure 13 may be observed by an observer on either side of the pixel element structure 13. When the pixel element structure 13 is turned on, a scene on the opposite side of the pixel element structure 13 may be observed by the observer on the side where no light is emitted (on the back side). Thus, a transparent effect may be realized, regardless of whether the pixel element structure 13 is turned on or turned off.

In one embodiment, as shown in FIG. 13, the first direction and the second direction may be a horizontal direction and a vertical direction, respectively. That is, the first direction may be perpendicular to the second direction. In another embodiment, the first direction and the second direction may be arranged in other directions, and the second direction may intersect the first direction. The first direction and the second direction in FIG. 13 are for illustrative purposes and are not intended to limit the scope of the present disclosure.

In one embodiment, the first sub-pixel element 131, the second sub-pixel element 132 and the third sub-pixel element 133 may be sub-pixel elements in three different colors, and the three different colors may be red, blue and green respectively. That is, the first sub-pixel element 131 may be a sub-pixel element in any one color of red, blue and green, and the second sub-pixel element 132 and the third sub-pixel element 133 may be sub-pixel elements in the other two colors than the color of first sub-pixel element 131 among the red sub-pixel element, the blue sub-pixel element and the green sub-pixel element.

For example, when the first sub-pixel element 131 is a red sub-pixel element, the second sub-pixel element 132 may be a blue sub-pixel element and the third sub-pixel element 133 may be a green sub-pixel element, or the second sub-pixel element 132 may be a green sub-pixel element and the third sub-pixel element 133 may be a blue sub-pixel element. When the first sub-pixel element 131 is a blue sub-pixel element, the second sub-pixel element 132 may be a red sub-pixel element and the third sub-pixel element 133 may be a green sub-pixel element, or the second sub-pixel element 132 may be a green sub-pixel element and the third sub-pixel element 133 may be a red sub-pixel element. When the first sub-pixel element 131 is a green sub-pixel element, the second sub-pixel element 132 may be a red sub-pixel element and the third sub-pixel element 133 may be a blue sub-pixel element, or the second sub-pixel element 132 may be a blue sub-pixel element and the third sub-pixel element 133 may be a red sub-pixel element.

The layout and the colors of the first sub-pixel element 131, the second sub-pixel element 132 and the third sub-pixel element 133 in the pixel element structure shown in FIG. 13 are for illustrative purposes, and are not intended to limit the scope of the present disclosure. In another embodiment, the first sub-pixel element 131, the second sub-pixel element 132 and the third sub-pixel element 133 in one pixel element structure may have other layouts and/or other colors.

FIG. 14 is a schematic structural diagram in a top view of a primary pixel element structure according to the embodiment of the present disclosure. As shown in FIG. 14, the primary pixel element structure 1400 may comprise a plurality of pixel element structures 13 arranged in the second direction. Scanning lines 1404 and data lines 1402 for controlling the pixel element structures 13 may be disposed in a wiring region 1403. The detailed structure of the pixel element structure 13 may be referred to FIG. 13 and the corresponding descriptions, which is not repeated here. The relative position of the wiring region 1403 and the primary pixel element structure 1400 shown in FIG. 14 are for illustrative purposes and are not intended to limit the scope of the present disclosure.

In particular, the pixel light-transmitting regions 1301' of the adjacent pixel element structures 13 may be combined to form a primary pixel light-transmitting region 1401, which may be a continuous light-transmitting region without any light-emitting regions and light-shielding regions. The primary pixel light-transmitting region 1401 may be arranged as a transparent film layer structure including an insulation layer, an organic film layer, etc.

When the primary pixel element structure 1400 is turned off, a scene on an opposite side of the primary pixel element structure may be observed by an observer on either side of the pixel element structure. When the primary pixel element structure 1400 is turned on, a scene on the opposite side of the primary pixel element structure may be observed by the observer on a side where no light is emitted.

In one embodiment, as shown in FIG. 14, the primary pixel element structure 1400 may comprise two pixel element structures 13 arranged in the second direction, and the pixel light-transmitting regions 1301' of the two adjacent pixel element structures 13 may be combined to form the primary pixel light-transmitting region 1401. That is, the primary pixel element structure 1400 may comprise a primary pixel light-transmitting region 1401, two first sub-pixel elements 131, two second sub-pixel elements 132, and two third sub-pixel elements 133. The aperture ratios of the primary pixel light-transmitting region 1401, the first sub-pixel elements 131, the second sub-pixel elements 132, and the third sub-pixel elements 133 may be determined according to various application scenarios.

In one embodiment, when the first sub-pixel element 131 is a blue sub-pixel element, the second sub-pixel element 132 is a green sub-pixel element, and the third sub-pixel element 133 is a red sub-pixel element, in each primary pixel element structure, the blue sub-pixel element may an aperture ratio larger than the green sub-pixel element and the red sub-pixel element. For example, the aperture ratio of the primary pixel light-transmitting region 1401, the first sub-pixel elements 131 (i.e., blue sub-pixel elements), the second sub-pixel elements 132 (i.e., green sub-pixel elements), and the third sub-pixel elements 133 (i.e., red sub-pixel elements) may be approximately 59%, 15.9%, 5.8%, and 5.0%, respectively.

In another embodiment, the primary pixel element structure 1400 may comprise more than two pixel element structures 13 arranged in the second direction, and the pixel light-transmitting regions 1301' of the more than two adjacent pixel element structures 13 may be combined to form the primary pixel light-transmitting region 1401. The aperture ratio of the primary pixel light-transmitting region 1401, the first sub-pixel elements 131, the second sub-pixel elements 132, and the third sub-pixel elements 133 may also vary.

Figure 15:
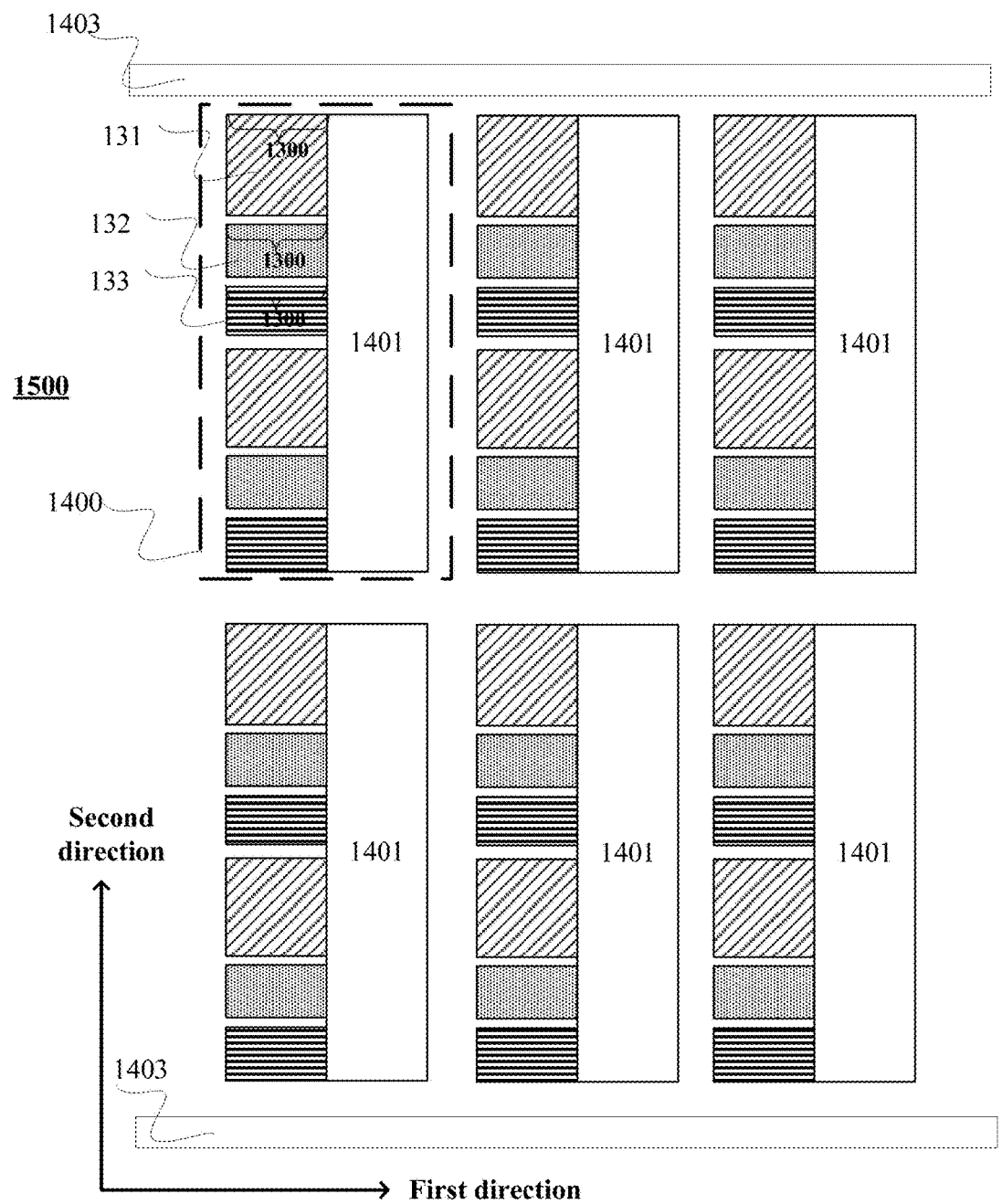
FIG. 15 is another schematic structural diagram of the array structure in a top view according to an embodiment of the present disclosure.

FIG. 15 is a schematic structural diagram of an array structure in a top view according to an embodiment of the present disclosure. As shown in FIG. 15, the array structure 1500 may comprise a plurality of primary pixel element structures 1400 arranged in a matrix, and a wiring region 1403 disposed with signal lines for controlling the primary pixel element structures. The detailed structure of the primary pixel element structure 1400 may be referred to FIG. 14 and the corresponding descriptions, which is not repeated here.

Figure 16A:
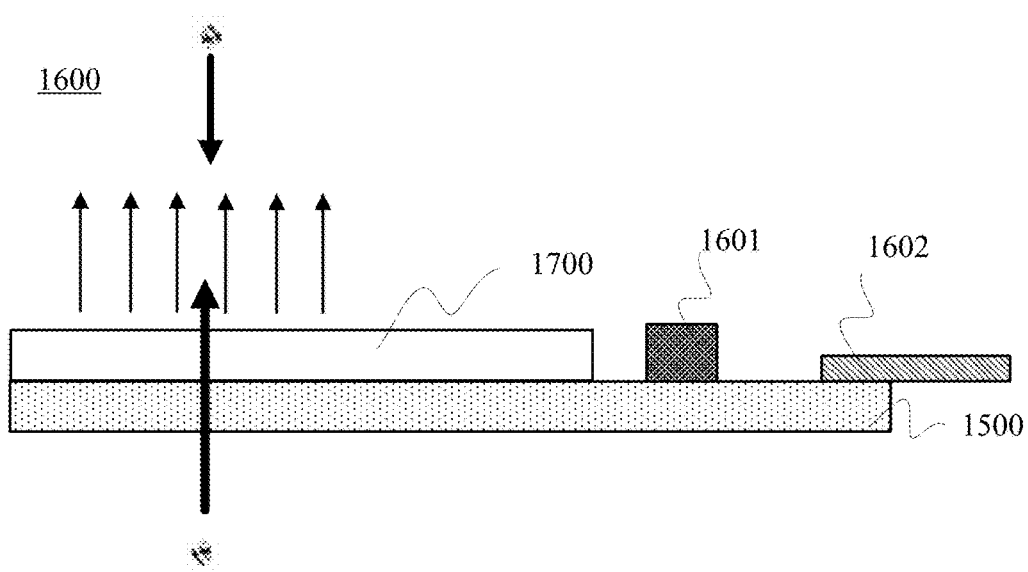
FIG. 16*a* and FIG. 16*b* are other schematic structural diagrams of the display device in section views according to an embodiment of the present disclosure.
Figure 16B:
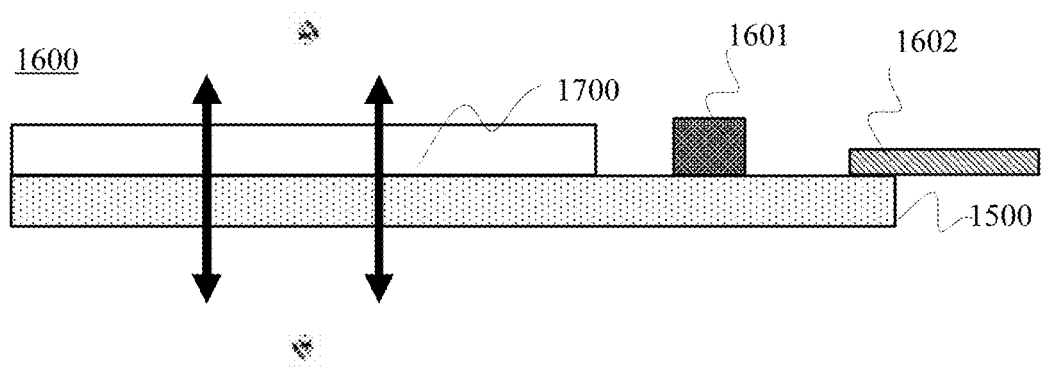

FIG. 16a and FIG. 16b are schematic structural diagrams of a display device in section views according to an embodiment of the present disclosure. As shown in FIG. 16a and FIG. 16b, the display device 1600 may comprise an array structure 1500, an IC drive circuit 1601, a flexible circuit board 1602, and a second substrate 1700. Other appropriate components may also be included. The IC drive circuit 1601 and the flexible circuit board 1602 may be disposed on the array structure 1500, and the second substrate 1700 may be arranged opposite to the array structure 1500. In one embodiment, the second substrate 1700 may be a color film substrate, and an exemplary structure is shown in FIG. 17.

Figure 17:
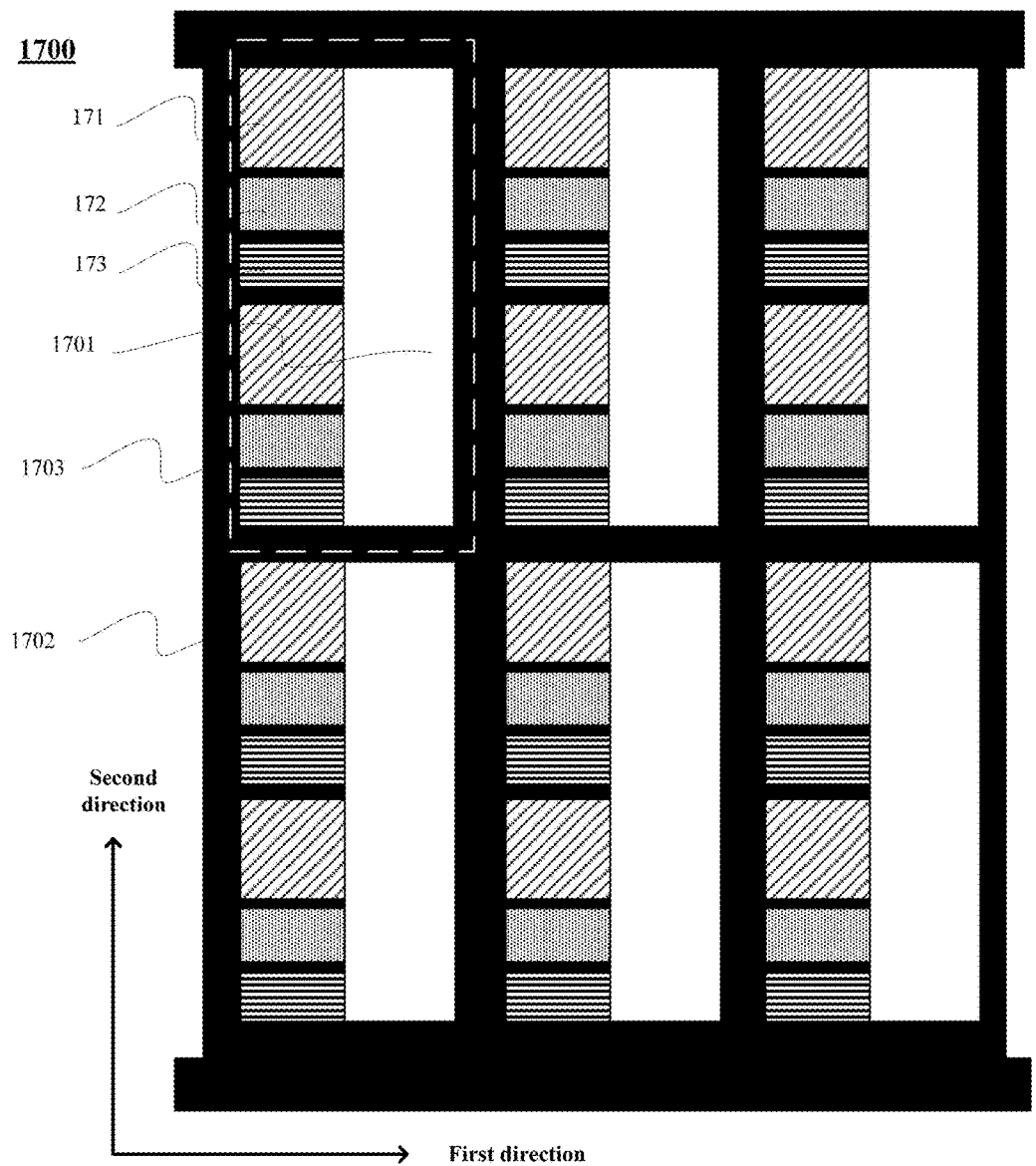
FIG. 17 is a schematic structural diagram of a color film structure in a top view according to an embodiment of the present disclosure.

FIG. 17 is a schematic structural diagram of a color film structure in a top view according to an embodiment of the present disclosure. As shown in FIG. 17, the color film substrate 1700 may comprise a plurality of primary color barriers 1703 arranged in a matrix. Each primary color barrier 1703 may comprise a plurality of first color barriers 171, a plurality of second color barriers 172, a plurality of third color barriers 173, and a primary transparent region 1701. In one embodiment, as shown in FIG. 17, each primary color barrier 1703 may comprise two first color barriers 171, two second color barriers 172, two third color barriers 173, and a primary transparent region 1701.

Referring to FIG. 15 and FIG. 17, the plurality of primary color barriers 1703 of the color film substrate 1700 may be one-to-one corresponding to the plurality of primary pixel element structures 1400 of the array structure 1500. The plurality of first color barriers 171, the plurality of second color barriers 172, and the plurality of third color barriers 173 in the primary color barrier 1703 may be one-to-one corresponding to the light-emitting regions 1300 of the plurality of the first sub-pixel elements 131, the light-emitting region 1300 of the plurality of the second sub-pixel elements 132, and the light-emitting region 1300 of the plurality of the third sub-pixel elements 133 in the primary pixel element structure 1400, respectively.

For example, when the first sub-pixel element 131 is a blue sub-pixel element, the second sub-pixel element 132 is a green sub-pixel element, and the third sub-pixel element 133 is a red sub-pixel element, the first color barrier 171 may be a blue color barrier, the second color barrier 172 may be a green color barrier, and the third color barrier 173 may be a red color barrier.

The primary transparent region 1701 of the primary color barrier 1703 may be corresponding to the primary pixel light-transmitting region 1401 in the primary pixel element structure 1400. The aperture ratio of the primary transparent region 1701, the first color barrier 171, the second color barrier 172, and the third color barrier 173 in each primary color barrier 1703 may be slightly larger than the aperture ratio of the primary pixel light-transmitting region 1401, the first sub-pixel elements 131, the second sub-pixel elements 132, and the third sub-pixel elements 133 in each primary pixel element structure 1400, respectively.

The color film substrate 1700 may also comprise a black matrix 1702 disposed among the adjacent color barriers, which corresponds to the light shielding regions of the sub-pixel elements. The black matrix 106 may also overlap the wiring region 1403 of the array structure 1500.

Returning to FIG. 16*a* and FIG. 16*b*, because the primary pixel light-transmitting regions are continuous light-transmitting regions without any light-emitting regions and light-shielding regions, the transmissivity of the display device 1600 may be further improved. As shown in FIG. 16*a*, when the display device 1600 is turned on, a scene on the opposite side of the display device may be observed by the observer on the side where no light is emitted (on the back side). As shown in FIG. 16*b*, when the display device 1600 is turned off, a scene on an opposite side of the display device may be observed by an observer on either side of the display device. Thus, a transparent effect may be realized, regardless of whether the display device 1600 is turned on or turned off.

In summary, an embodiment of the present disclosure provides a primary pixel element structure including a plurality of pixel element structures arranged in a second direction. A pixel element structure comprises first, second, and third sub-pixel elements, each comprising a light-emitting region and a light-transmitting region disposed at one side of the light-emitting region and adjacent to the light-emitting region in a first direction, the first direction intersecting the second direction. The light-transmitting regions of the first, second, and third sub-pixel elements in the pixel element structure are combined to form a pixel light-transmitting region, and the pixel light-transmitting regions of the plurality of pixel element structures are combined to form a primary pixel light-transmitting region. When the pixel element structure is turned off, a scene on an opposite side of the pixel element structure is observed by an observer on either side of the pixel element structure. When the pixel element structure is turned on, a scene on the opposite side of the pixel element structure is observed by the observer on a side where no light is emitted.

With the technical solution of the present disclosure, the nontransparent anode is used in the organic light-emitting diode light-emitting structure to thereby emit light on a single side so as to lower power consumption of an OLED display device. The light-transmitting region is introduced to each sub-pixel element. The light-transmitting regions of the first, second, and third sub-pixel elements in the pixel element structure are combined to form the pixel light-transmitting region and, meanwhile, the pixel light-transmitting regions of the plurality of pixel element structures in the primary pixel element structure are combined to form the primary pixel light-transmitting region. The pixel light-transmitting region and the primary pixel light-transmitting region are continuous light-transmitting regions without any light-emitting regions and light-shielding regions, there further improving the transmissivity of light rays of a display panel by means of the light-transmitting region so as to achieve transparent display of the OLED display device.

Evidently those skilled in the art can make various modifications and variations to the present disclosure without departing from the spirit and scope of the present disclosure. Thus the present disclosure is also intended to encompass these modifications and variations thereto so long as the modifications and variations come into the scope of the claims appended to the present disclosure and their equivalents.

What is claimed:

1. A display device, comprising:
an array structure comprising a plurality of primary pixel element structures arranged in a matrix;
wherein a primary pixel element structure comprises a plurality of pixel element structures arranged in a second direction,
a pixel element structure comprises first, second, and third sub-pixel elements, each comprising a light-emitting region and a light-transmitting region disposed at one side of the light-emitting region and adjacent to the light-emitting region in a first direction, and the first direction being perpendicular to the second direction,
wherein:
the light-transmitting regions of the first, second, and third sub-pixel elements in the pixel element structure are combined to form a pixel light-transmitting region,
when the display device is turned off, a scene on an opposite side of the display device is observed by an observer on either side of the display device, and
when the display device is turned on, a scene on the opposite side of the display device is observed by the observer on a side where no light is emitted.

2. The display device according to claim 1, wherein:
the pixel light-transmitting regions of the plurality of pixel element structures in the primary pixel element structure are combined to form a primary pixel light-transmitting region.

3. The display device according to claim 1, wherein the pixel light-transmitting region is a continuous light-transmitting region without any light-emitting regions and light-shielding regions.

4. The display device according to claim 2, wherein the primary pixel light-transmitting region is a continuous light-transmitting region without any light-emitting regions and light-shielding regions.

5. The display device according to claim 2, wherein the primary pixel light-transmitting region is arranged as a transparent film layer structure comprising a transparent insulation layer and a transparent organic film layer.

6. The display device according to claim 2, further comprising a color film substrate disposed opposite to the array structure.

7. The display device according to claim 6, wherein the color film substrate further comprises:
a plurality of primary color barriers arranged in a matrix and one-to-one corresponding to the plurality of primary pixel element structures of the array structure,
wherein a primary color barrier comprises:
a plurality of first color barriers, a plurality of second color barriers and a plurality of third color barriers corresponding to the light-emitting regions of the first, second, and third sub-pixel elements of the plurality of pixel element structures in the primary pixel element structure, respectively; and
a primary transparent region corresponding to the primary pixel light-transmitting region in the primary pixel element structure.

8. The display device according to claim 7, wherein:
aperture ratio of the primary transparent region, the first color barriers, the second color barriers, and the third color barriers in the primary color barrier is slightly larger than the aperture ratio of the primary pixel light-transmitting region, the first sub-pixel elements, the second sub-pixel elements, and the third sub-pixel elements in the primary pixel element structure, respectively.

9. The display device according to claim 1, wherein the primary pixel element structure includes a total number of two pixel element structures arranged in the second direction.

10. The display device according to claim 1, wherein the light-emitting region further comprises:
an organic light-emitting diode light-emitting structure comprising a first substrate, and a nontransparent anode, a pixel defining layer, an organic layer, and a cathode sequentially arranged above the first substrate.

11. The display device according to claim 10, wherein the organic light-emitting diode light-emitting structure is a top-emitting organic light-emitting diode structure.

12. The display device according to claim 11, wherein the organic light-emitting diode light-emitting structure is either a passive matrix top-emitting organic light-emitting diode structure or an active matrix top-emitting organic light-emitting diode structure.

13. The display device according to claim 1, wherein:
the first sub-pixel element is any one of a red sub-pixel element, a blue sub-pixel element, and a green sub-pixel element; and
the second sub-pixel element and the third sub-pixel element are each of colors different from the color of the first sub-pixel element.

14. A display device, comprising:
an array structure comprising a plurality of primary pixel element structures arranged in a matrix;
wherein a primary pixel element structure comprises a plurality of pixel element structures arranged in a second direction,
a pixel element structure comprises first, second, and third sub-pixel elements, each comprising a light-emitting region and a light-transmitting region disposed at one side of the light-emitting region and adjacent to the light-emitting region in a first direction, and the first direction being perpendicular to the second direction,
wherein:
the first sub-pixel element is a blue sub-pixel element;
the second sub-pixel element is a green sub-pixel element;
the third sub-pixel element is a red sub-pixel element;
when the display device is turned off, a scene on an opposite side of the display device is observed by an observer on either side of the display device; and
when the display device is turned on, a scene on the opposite side of the display device is observed by the observer on a side where no light is emitted.

15. The display device according to claim 14, wherein in each primary pixel element structure, the blue sub-pixel element has an aperture ratio larger than the green sub-pixel element.

16. The display device according to claim 14, wherein in each primary pixel element structure, the blue sub-pixel element has an aperture ratio larger than the red sub-pixel element.

* * * * *